United States Patent [19]

Petro et al.

[11] Patent Number: 5,326,723
[45] Date of Patent: Jul. 5, 1994

[54] METHOD FOR IMPROVING STABILITY OF TUNGSTEN CHEMICAL VAPOR DEPOSITION

[75] Inventors: William G. Petro, San Jose; Farhad K. Moghadam, Los Gatos, both of Calif.

[73] Assignee: Intel Corporation, Santa Clara, Calif.

[21] Appl. No.: 942,985

[22] Filed: Sep. 9, 1992

[51] Int. Cl.$^5$ .............................................. H01L 21/00
[52] U.S. Cl. ................................................... 437/192
[58] Field of Search ............................. 437/192; 134/1

[56] References Cited

U.S. PATENT DOCUMENTS

| | | | |
|---|---|---|---|
| 3,892,650 | 7/1975 | Cuomo et al. | 204/192.15 |
| 4,563,367 | 1/1986 | Sherman | 118/50.1 |
| 5,041,311 | 8/1991 | Tsukune et al. | 427/255.3 |
| 5,043,299 | 8/1991 | Chang et al. | 437/192 |
| 5,180,432 | 1/1993 | Hansen | 118/697 |

*Primary Examiner*—Robert Kunemund
*Assistant Examiner*—C. Everhart
*Attorney, Agent, or Firm*—Blakely, Sokoloff, Taylor & Zafman

[57] ABSTRACT

A method for cleaning a chemical vapor deposition (CVD) process for depositing tungsten. After the tungsten has been deposited and the wafer has been removed from the chamber, the chamber undergoes an in-situ cleaning process. In the currently preferred embodiment the in-situ cleaning process consists of cleaning the chamber with nitrogen tri-fluoride ($NF_3$) and hydrogen ($H_2$) nitrogen ($N_2$) plasmas. The tungsten CVD cleaning process also includes purging the chamber with the dilute mixture of silane ($SiH_4$), argon (Ar) and nitrogen ($N_2$).

10 Claims, 2 Drawing Sheets

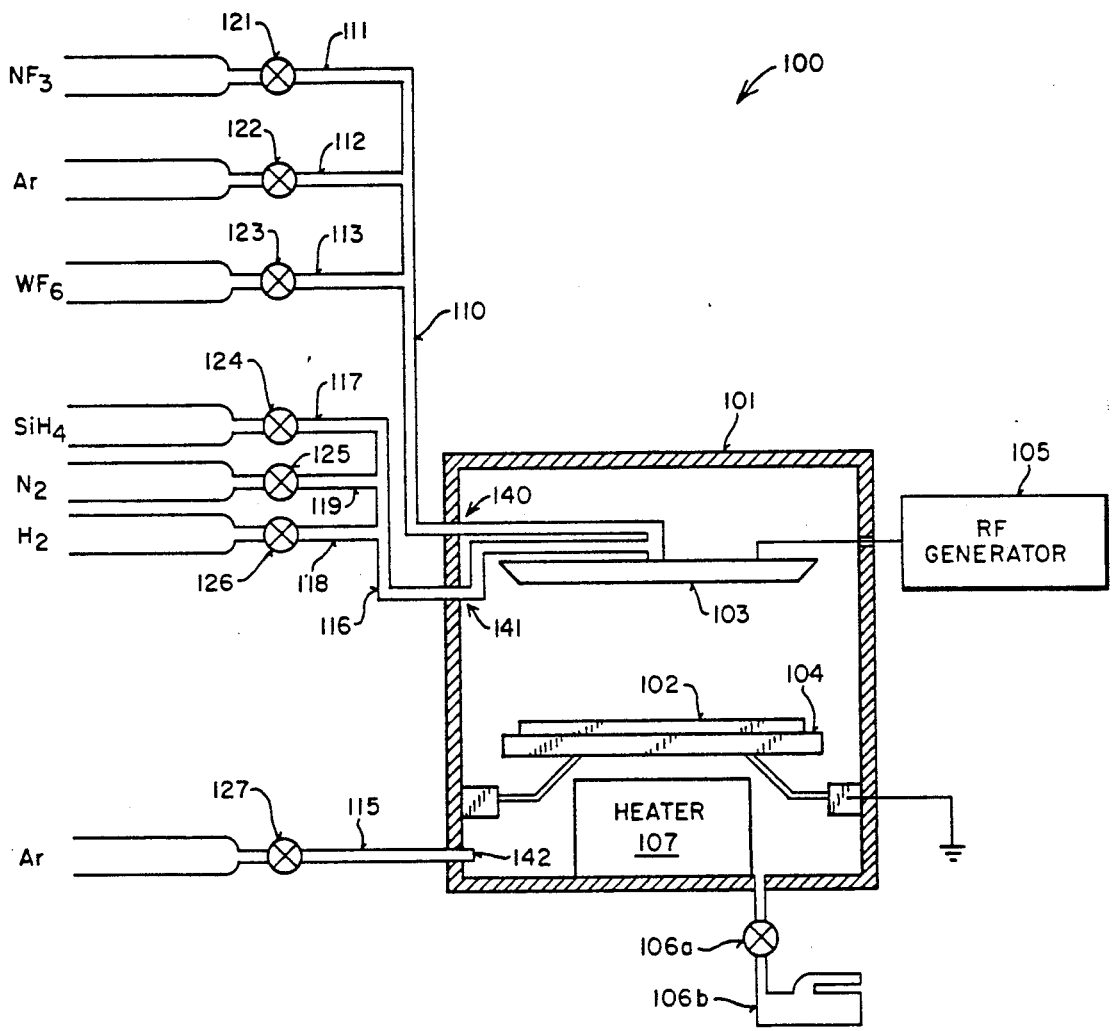
FIG _1

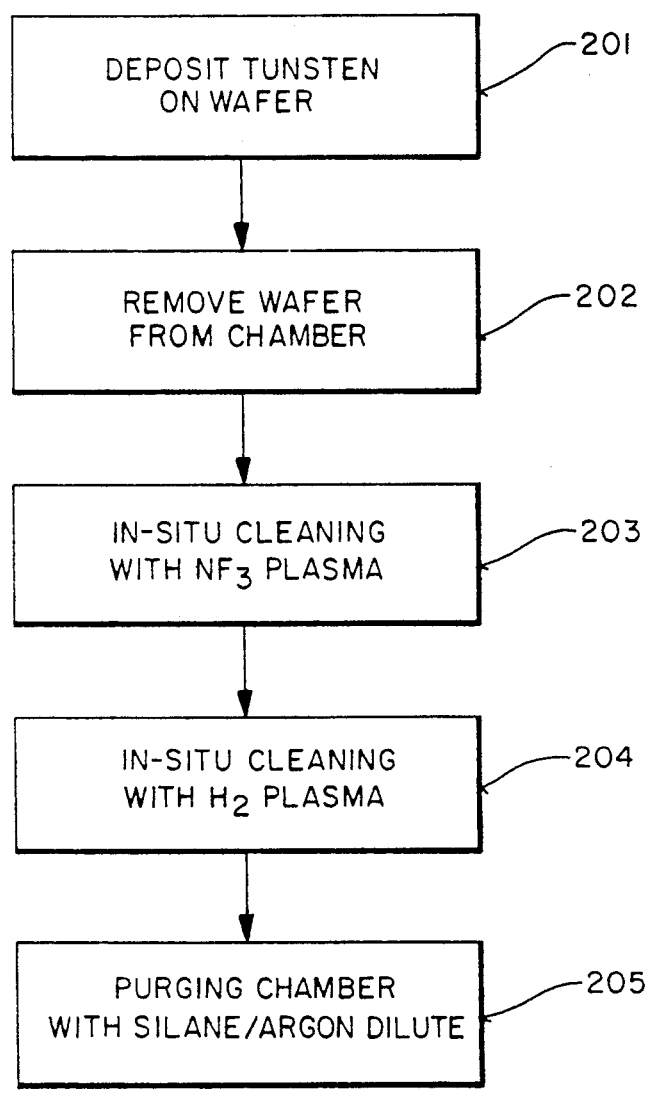

METHOD FOR IMPROVING STABILITY OF TUNGSTEN CHEMICAL VAPOR DEPOSITION

FIELD OF THE INVENTION

The present invention relates to the field semiconductor fabrication; more particularly, the present invention relates to the deposition of tungsten in a chemical vapor deposition process and the cleaning processes and devices utilized to remove deposits and/or contamination from the processing chamber.

BACKGROUND OF THE INVENTION

In the fabrication of some semiconductor wafers, thin films of tungsten are deposited to provide gate interconnections, contacts, vias, and contact barrier metals. Tungsten provides material for interconnect applications as a result of its low resistance, low stress, excellent conformal step coverage and because its thermal expansion coefficient closely matches that of silicon. Typically, the tungsten films are formed both in selective and blanket deposition modes.

Tungsten thin films are usually deposited using a chemical vapor deposition (CVD) process, wherein solid films are formed on an integrated circuit wafer by the chemical reaction of vapor phase chemicals (reactants) that contain the required constituent gases. Three major CVD processes exist: atmospheric pressure CVD (APCVD), low pressure CVD (LPCVD), and plasma-enhanced CVD (PECVD). APCVD and LPCVD systems are characterized by the requisite pressure for the deposition. Typically, these systems use thermal energy to promote chemical reactions responsible for the film deposition. PECVD systems, however, are characterized by pressure and by its method of energy input. PECVD systems do not rely solely on thermal energy, but instead use a radio-frequency (RF) induced glow discharge plasma to transfer energy into the reactant gases, allowing the integrated circuit wafer to remain at a lower temperature than in APCVD or LPCVD processes.

Generally, in CVD systems, the films are deposited in batch reactors which accommodate a large number of wafers at the same time. Single wafer systems are also available which accommodate one wafer at a time.

In the course of many semiconductor device processing steps, unwanted deposits and contaminants are formed in the chamber of the processing equipment. As these deposits and contaminants accumulate in successive runs, they can interfere with the deposition process, causing particle and chemical contamination of the wafers, thereby resulting in a low die yield. Thus, frequent cleaning of the chamber wall is required. Specifically with regard to thin tungsten films, their deposition by the reduction of tungsten hexafloride ($WF_6$) vapor can be adversely affected by the accumulation of reaction by-products, such as hydrogen, fluorine, and fluorine-containing compounds, in the reaction chamber. These by-products are generated during the deposition reaction as well as subsequent chamber cleaning processes, and can cause excessive non-uniformity and variability of critical film properties, such as thickness, resistivity, and reflectivity.

In the prior art, chamber cleaning usually encompasses the partial disassembly of the process chamber and cleaning the chamber with corrosive and toxic chemicals. In certain tungsten deposition processes, film properties (specifically within wafer thickness non-uniformity) were found to reach unacceptable levels after as few as fifty wafers. When this occurs, the chamber must then be cooled, vented, opened, manually cleaned with wet chemicals, realigned, sealed, pumped, leak-checked, heated and re-qualified so that the tungsten deposition process could be subsequently performed. This cleaning procedure normally requires approximately eight hours of equipment time. This cleaning procedure causes long equipment downtimes, resulting in as much as a sixty percent downtime for the chamber cleaning alone. High labor costs and loss of process repeatability due to chamber disassembly and reassembly, the breakage and/or degregation of the chamber and other equipment parts due to the disassembly and reassembly and handling of the chamber and other process hardware during the cleaning process are also drawbacks to this cleaning procedure. Furthermore, the chemical contamination of the chamber by liquids used in cleaning and handling, along with the safety hazards associated with the use of corrosive and toxic chemicals, are also drawbacks.

As will be shown, the present invention provides a method of cleaning the chamber that is conducted in the same vacuum environment in which the film is deposited (in-situ). The present invention comprises a technique for scavenging or removing the by-products from the reaction chamber without the need for an extensive and time-consuming manual cleaning procedures. The present invention also reduces the downtime resulting from chamber cleaning to approximately ten percent.

SUMMARY OF THE INVENTION

A method for cleaning a chemical vapor deposition (CVD) process chamber for depositing tungsten. After the tungsten has been deposited and the wafer has been removed from the chamber, the chamber undergoes an in-situ cleaning process. In the currently preferred embodiment, the in-situ cleaning process comprises cleaning the chamber with nitrogen tri-fluoride ($NF_3$) and hydrogen-nitrogen ($N_2$-$N_2$) plasmas. The tungsten CVD cleaning process then includes purging the chamber with a dilute mixture of silane ($SiH_4$), argon (Ar) and nitrogen ($N_2$). In the currently preferred embodiment, the silane comprises approximately one to two percent of the dilute mixture.

BRIEF DESCRIPTION OF DRAWINGS

The present invention will be understood more fully from the detailed description given below and from the accompanying drawings in the preferred embodiment of the invention, which, however, should not be taken to limit the invention to the specific embodiments, but are for explanation and understanding only.

FIG. 1 is the chemical vapor deposition (CVD) system of the present invention.

FIG. 2 is a flow chart of the process of the present invention.

DETAILED DESCRIPTION OF THE INVENTION

A method of cleaning the inside of a tungsten chemical vapor deposition (CVD) system is described. In the following description, numerous specific details are set forth, such as specific pressures, compounds, etc., in order to provide a thorough understanding of the preferred embodiment of the present invention. It will be understood to those skilled in the art that the present invention may be practiced without these specific details. Also, well-known processing steps have been shown in block diagram form, rather than in detail, in order to avoid unnecessarily obscuring the present invention.

Referring to FIG. 1, the CVD system 100 is the single wafer load-locked system. In the currently preferred embodiment, CVD system 100 is a parallel plate thermal CVD system. CVD system 100 utilizes chamber 101 as the environment for depositing the tungsten film on a semiconductor wafer, such as wafer 102. In the currently preferred embodiment, wafer 200 is a 200 mm wafer. It should be noted that the parallel plate single wafer reactor is capable of operating with other sized wafers. In order to deposit the tungsten, volatile components of the tungsten must exist. In the currently preferred embodiment, tungsten hexafloride, $WF_6$, is used.

An initial thin tungsten (W) film ("nucleation layer") is deposited by silane ($SiH_4$) reduction. In one embodiment, the reaction mechanisms for this process are:

$$2WF_6 + 2SiH_4 \rightarrow 2W + 3SiF_4 + 6H_2$$

and $$WF_6 + 2SiH_4 \rightarrow W + 2SiHF_3 + 3H_2$$

where silicon tetrafluoride ($SiF_4$), hydrogen ($H_2$) and $SiHF_3$ are by-products. This is followed by a thick W film ("bulk W deposition") utilizing hydrogen reduction according to the chemical equation:

$$WF_6 + 3H_2 \rightarrow W + 6HF$$

where hydrogen fluoride (HF) is a by-product. Thus hydrogen- and fluoride-containing by-products are generated during these deposition reactions. Subsequent etching of the backside of the wafer with a nitrogen tri-fluoride ($NF_3$) plasma to remove residual W) and chamber cleaning with NF3 and hydrogen ($H_2$)/nitrogen ($N_2$) plasmas generate additional quantities of hydrogen- and fluoride-containing by-products.

A wafer, such as wafer 102, once inside chamber 101 can be subjected to pressure and temperature variations by CVD system 100. Pressure is controlled and regulated by a pressure control valve 106a and vacuum pump 106b. In the currently preferred embodiment, pressure control valve 106a establishes and maintains the pressure of chamber 101 at between 1-100 Torr. Temperature is varied and regulated by a heater 107 and a temperature sensor (not shown). In the currently preferred embodiment, heater 107 is a radiant heating lamp.

Wafer 102 rests on an electrode, succeptor 104. In the currently preferred embodiment, succeptor 104 is electrically grounded, yet transfers heat to wafer 102 from heater 107. Above wafer 102 is a second electrode, showerhead 103. Showerhead 103 has a special showerhead design having holes which allow it to distribute gases over the top surface of wafer 102 in the same manner as a showerhead.

The tungsten fluoride ($WF_6$) vapor enters chamber 101 from showerhead 103 through inlet 140 via manifold 110. Manifold 110 is supplied by $WF_6$ supply line 113. The flow of $WF_6$ in supply line 113 is controlled by control valve 123. Hydrogen ($H_2$) vapor enters chamber 101 from showerhead 103 through inlet 141 via manifold 116. Manifold 116 is supplied by $H_2$ supply line 118. The flow of $H_2$ is controlled by control valve 126.

Nitrogen tri-fluoride ($NF_3$) and the $H_2/N_2$ mixture enter chamber 101 through showerhead 103 respectively. Showerhead 103 is supplied by gas manifolds 110 and 116. Gas manifold 110 is supplied by gas lines 111, 112 and 113. Nitrogen tri-fluoride ($NF_3$) flows through gas line 111 into gas manifold 110. The flow of $NF_3$ is controlled by control valve 121. The $H_2/N_2$ mixture enters chamber 101 by inlet 141 from gas manifold 116. Gas manifold 116 is supplied by $H_2$ supply line 118 and $N_2$ supply line 119. The flow of $H_2$ is controlled by control valve 118, and the flow of $N_2$ is controlled by control valve 125.

Silane ($SiH_4$) enters chamber 101 through inlet 141. Inlet 141 is fed by gas manifold 116. Gas manifold 116 is fed by $SiH_4$ supply line 117. The flow of silane is controlled by control valve 124.

Argon (Ar) enters chamber 101 through inlets 140 and 142. Inlet 140 is fed by gas manifold 110. Gas manifold 110 is fed by Ar supply line 112. The flow of Ar is controlled by control valve 122. Inlet 142 is fed by Ar supply line 115. The flow of Ar through supply line 115 is controlled by control valve 127. The flow of argon is controlled by control valve 127.

FIG. 2 is a flow chart depicting the tungsten film deposition process. Stage 201 comprises depositing tungsten on the semiconductor wafer. During stage 201 of the process, wafer 102 is placed into chamber 101 face up on succeptor 104. Chamber 101 is then sealed. The sealed chamber is pumped to the process pressure using vacuum pump 106. In the present invention, the process pressure is pumped to between 1-100 Torr. In the currently preferred embodiment, the pressure is brought to 80 Torr. The temperature is stabilized to the process, or wafer, temperature. Wafer 102 is heated to the process temperature. In the currently preferred embodiment, the process temperature, referred to as the wafer temperature, is brought to 475° C.

Once temperature and pressure parameters have been set, the flows of $WF_6$, $SiH_4$ and $H_2$ begin at their respective times. The temperature of wafer 102 due to the heating of succeptor 104 by heater 107 causes a "blanket" of solid tungsten to be formed on wafer 102. However, tungsten is also deposited on the inside of the chamber as well as other deposition by-products.

Once the deposition is completed, heater 107 is turned off. The flow of the reactants are turned off, and wafer 102 is removed from the chamber (step 202). Thus, after the deposition of thin tungsten film, by-products are generated in chamber 101. The remaining steps in the process, steps 203-205, involve cleaning the chamber. It should be noted that by-products are generated during the subsequent chamber cleaning processes as well. In the present invention, these by-products are: fluorine (F), hydrogen fluoride (HF), nitrogen fluoride (NF), silicon fluoride (SiF), silicon tri-fluoride ($SiF_3$), silicon tetrafluoride ($SiF_4$). Both the by-products generated during the deposition, as well as those resulting from the subsequent chamber cleaning process, can cause excessive nonuniformities of critical film properties for wafers undergoing subsequent depositions in a partially cleaned chamber. In the currently preferred embodiment, the cleaning process of steps 203-205 is performed after the removal of each wafer from chamber 101.

The present invention comprises a process for scavenging or removing these by-products from the reaction chamber without the need for an extensive and time-consuming manual cleaning procedure. The process of the present invention consists of an in-situ purge of the reaction chamber with a mixture of silane, argon and nitrogen gases after each deposition. This purge scavenges reactive fluorine-containing compounds (fluorine, hydrogen fluoride) and replaces them with relatively inert silicon tetrafluoride ($SiF_4$).

The cleaning of chamber 101 is done by generating plasma with certain gases in chamber 101, when it is empty. Initially, the cleaning of chamber 101 occurs in-situ with nitrogen tri-fluoride ($NF_3$) and $H_2/N_2$ plasmas. Subsequently, these gases are pumped away, however their by-products remain, eventually a manual wet cleaning of the chamber is performed.

The cleaning process of the present invention is performed in-situ, such that it occurs within the same chamber and under similar conditions as the deposition. The in-situ cleaning of the chamber begins by exposing the chamber to a nitrogen tri-fluoride plasma. Control valve 121 permits the flow of nitrogen tri-fluoride ($NF_3$) through gas line 111 into gas manifold 110 to showerhead 103. The nitrogen tri-fluoride ($NF_3$) then enters chamber 101. As it does, RF generator 105, which is coupled to showerhead 103, applies an RF potential to showerhead 103 that sets up a potential between the two electrodes, showerhead 103 and succeptor 104. This potential allows the inside of chamber 101 to be exposed to an RF plasma while the nitrogen tri-fluoride is introduced into chamber 101. In the currently preferred embodiment, the flow rate of nitrogen tri-fluoride is 150 standard cubic centimeter/minute (sccm).

The application of the RF potential is accomplished by switching on RF generator 105. RF generator 105 is a high frequency generator, operating at a frequency of 13.36 MHz. When RF generator 105 is switched on, showerhead 103 is placed at a high RF potential. In the currently preferred embodiment, the power from RF generator 105 is between 200-500 watts. The nitrogen tri-fluoride ($NF_3$) flows for a few seconds until it achieves a stable flow. The RF potential creates an RF field which supplies energy to the gas within chamber 101. The gas becomes excited and forms a glow discharge or plasma (the plasma refers to the partially ionized gas, while the glow discharge refers to the plasma maintained over a specific pressure range (e.g., 0.1-5 Torr). The plasma, in turn, transfers energy to the nitrogen tri-fluoride ($NF_3$) causing the creation of free fluorine and nitrogen species. The fluorine tends to etch tungsten (W) and form $WF_6$ and F-containing by-products.

The cleaning of chamber 101 then continues with a second plasma cleaning step (stage 204). The second plasma cleaning step begins with control valve 122 permitting the flow of hydrogen/nitrogen mixture through gas line 112 into manifold 110 and into chamber 101 via showerhead 103. The mixture of hydrogen and nitrogen contains approximately 500 cc of hydrogen to 20 cc of nitrogen. Once a stable flow is achieved, RF generator 105 is switched on and applies a potential which causes the formation of a glow discharge or plasma (with pressure between 0.1-5 Torr). The plasma, in turn, transfers energy into the hydrogen/nitrogen mixture causing the creation of hydrogen and nitrogen species. Hydrogen fluoride (HF), hydrogen (H), and fluorine (F) species remain in the chamber after the $H_2/N_2$ plasma.

After the second in-situ plasma cleaning, chamber 101 is purged with a mixture of silane, argon, and nitrogen (step 205). The purging is accomplished in-situ, so that it is at the same temperature as the deposition process. The purging is performed with a dilute of silane and argon gases. In the currently preferred embodiment, the argon and silane are mixed, such that the resulting mixture is 1-2% silane with the remainder being argon and nitrogen. Note that mixtures of other proportions of silane and argon can be used in the present invention. In the currently preferred embodiment, the mixing of the $SiH_4$ and $N_2$ occurs outside the chamber in mixing manifold 116 and enters chamber 101 through showerhead 103 via inlet 141. The Ar is introduced immediately above the showerhead from manifold 110 via inlet 140. However, it should be noted that the mixing could occur in chamber 101. The gases enter mixing manifold 115 from supply lines 117 and 119. In the currently preferred embodiment, the flow rate of silane is 30 sccm, the flow rate of nitrogen is 300 sccm and the flow rate of argon is 1400 sccm. Note that the flow rates may be varied, such that the proper proportions of each are attained. The dilute of silane and argon enters chamber 101 at the showerhead 103. The Ar gas is also introduced from inlet 142 at the bottom of chamber 101.

The result of the introduction of the gas mixture into chamber 101 is to replace a portion of the fluorine containing compounds, such as hydrogen fluoride (HF) and fluorine (F), with relatively inert silicon tetrafluoride ($SiF_4$) and $H_2$. Subsequently, these gases and by-products are pumped away.

The present invention reduces the downtime of chamber 101 due to chamber cleans to ten percent. The reduction in downtime results in improving equipment utilization and a corresponding reduction in cost per wafer to deposit tungsten. Thus, the sixty percent downtime of the prior art is reduced, and the present invention allows the system to run over hundreds of wafers before disassembling and cleaning, cooling, venting, opening, manually cleaning with wet chemicals, realigning, sealing, pumped leak-checked, heating and requalifying are needed as a procedure to clean chamber 101.

Whereas many alterations and applications of the present invention will no doubt become apparent to a person of ordinary skill in the art after having the read the foregoing description, it is understood that the particular embodiment shown and described by illustration is in no way intended to be limiting. Therefore, reference to details of the preferred embodiment are not intended to limit the scope of the claims which themselves recite only those features regarded as essential to the invention.

Thus, a process for fabricating a semiconductor wafer has been described.

We claim:

1. A process for cleaning a chemical vapored deposition (CVD) chamber used in tungsten CVD in the fabrication of a semiconductor wafer comprising the steps of:

removing the wafer from the CVD chamber;
    cleaning of the chamber with at least one plasma; and
    purging the chamber with a mixture of silane and argon.

2. The process as defined in claim 1 wherein the step of cleaning the chamber comprises in-situ cleaning of the chamber with nitrous fluoride (NF$_3$) and hydrogen (H$_2$) plasma.

3. The process as defined in claim 1 wherein the step of purging occurs at a predetermined pressure.

4. The process as defined in claim 3 wherein the predetermined pressure is from 0.1-5 Torr.

5. The process as defined in claim 1 wherein the mixture of silane, and argon gases comprises one to two percent silane.

6. In the fabrication of the semiconductor wafer, a tungsten CVD process comprising the steps of:
 depositing tungsten on the wafer;
 removing the wafer from the chamber;
 in-situ cleaning of the chamber with nitrous fluoride and hydrogen plasmas; and
 purging the chamber with a mixture of silane, nitrogen and argon gases at a pressure, wherein the silane comprises between one and two percent of the mixture.

7. The process as defined in claim 5 wherein in the step of cleaning includes:
 cleaning a chamber with nitrous fluoride plasma and then cleaning the chamber with the H$_2$ plasma.

8. The process as defined in claim 5 wherein the predetermined pressures between 0.1-5 Torr.

9. In the fabrication of semiconductor wafer, a tungsten CVD process comprising the steps of:
 depositing tungsten on the wafer;
 removing the wafer from the chamber;
 cleaning the chamber with nitrous fluoride plasma;
 cleaning the chamber with hydrogen plasma; and
 purging the chamber with the mixture of silane, nitrogen and argon gases at a pressure between 0.1-5 Torr, wherein the silane is between one and two percent of the mixture.

10. A tungsten CVD process in the fabrication of a semiconductor wafer comprising the steps of:
 depositing tungsten on the wafer;
 removing the wafer from the chamber;
 in-situ cleaning of the chamber; and
 purging the chamber with a mixture of silane, nitrogen and argon gases.

* * * * *

UNITED STATES PATENT AND TRADEMARK OFFICE
CERTIFICATE OF CORRECTION

PATENT NO.   : 5,326,723
DATED        : Jul. 5, 1994
INVENTOR(S)  : William G. Petro, et al It is certified that error appears in the above-indentified patent and that said Letters Patent is hereby corrected as shown below:

Column 2; Line 41; Delete "$(N_2-N_2)$"; Insert in place thereof --$(H_2-N_2)$--

Signed and Sealed this

Nineteenth Day of September, 1995

Attest:

BRUCE LEHMAN

Attesting Officer

Commissioner of Patents and Trademarks